| (12) United States Patent | (10) Patent No.: US 11,527,399 B2 |
| Cho et al. | (45) Date of Patent: Dec. 13, 2022 |

(54) WAFER CLEANING APPARATUS BASED ON LIGHT IRRADIATION AND WAFER CLEANING SYSTEM INCLUDING THE SAME

(71) Applicant: Samsung Electronics Co., Ltd., Suwon-si (KR)

(72) Inventors: Byungkwon Cho, Suwon-si (KR); Sangjine Park, Suwon-si (KR); Yongsun Ko, Suwon-si (KR); Seulgee Jeon, Hwaseong-si (KR); Jihoon Jeong, Seongnam-si (KR); Seongsik Hong, Dongducheon-si (KR)

(73) Assignee: Samsung Electronics Co., Ltd.

( * ) Notice: Subject to any disclaimer, the term of this patent is extended or adjusted under 35 U.S.C. 154(b) by 477 days.

(21) Appl. No.: 16/744,667

(22) Filed: Jan. 16, 2020

(65) Prior Publication Data

US 2020/0388484 A1 Dec. 10, 2020

(30) Foreign Application Priority Data

Jun. 10, 2019 (KR) ........................ 10-2019-0068277

(51) Int. Cl.
*H01L 21/02* (2006.01)
*B08B 7/00* (2006.01)
*H01L 21/67* (2006.01)

(52) U.S. Cl.
CPC ...... *H01L 21/02046* (2013.01); *B08B 7/0021* (2013.01); *B08B 7/0057* (2013.01);
(Continued)

(58) Field of Classification Search
CPC ............ B08B 7/0021; H01L 21/67028; H01L 21/67115; H01L 21/02101; H01L 21/67178; H01L 21/67098
See application file for complete search history.

(56) References Cited

U.S. PATENT DOCUMENTS 6,620,251 B2   9/2003   Kitano
6,630,031 B1   10/2003  Miki et al.
(Continued)

FOREIGN PATENT DOCUMENTS

JP   2003347278   12/2003
JP   2007088257   4/2007
(Continued)

*Primary Examiner* — Julia Slutsker
(74) *Attorney, Agent, or Firm* — Myers Bigel, P.A.

(57) ABSTRACT

Provided are a wafer cleaning apparatus based on light irradiation capable of effectively cleaning residue on a wafer without damaging the wafer, and a wafer cleaning system including the cleaning apparatus. The wafer cleaning apparatus is configured to clean residue on the wafer by light irradiation and includes: a light irradiation unit configured to irradiate light onto the wafer during the light irradiation; a wafer processing unit configured accommodate the wafer and to control a position of the wafer such that the light is irradiated onto the wafer during the light irradiation; and a cooling unit configured to cool the wafer after the light irradiation has been completed. The light irradiation unit, the wafer processing unit, and the cooling unit are sequentially arranged in a vertical structure with the light irradiation unit above the wafer processing unit and the wafer processing unit above the cooling unit.

20 Claims, 13 Drawing Sheets

(52) U.S. Cl.
CPC .. *H01L 21/02087* (2013.01); *H01L 21/67028* (2013.01); *H01L 21/67115* (2013.01)

(56) References Cited

U.S. PATENT DOCUMENTS

2004/0035847 A1* 2/2004 Gat .................. H01L 21/67115
                                                                  438/663
2014/0144462 A1* 5/2014 Verhaverbeke ... H01L 21/67126
                                                                  134/1.2
2018/0301360 A1* 10/2018 Nishide ................ G02B 5/0231

FOREIGN PATENT DOCUMENTS

| KR | 101353668 | 1/2014 |
| KR | 101865594 | 6/2018 |
| KR | 1020180113461 | 10/2018 |

* cited by examiner

WAFER CLEANING APPARATUS BASED ON LIGHT IRRADIATION AND WAFER CLEANING SYSTEM INCLUDING THE SAME

CROSS-REFERENCE TO RELATED APPLICATION

This application claims the benefit of Korean Patent Application No. 10-2019-0068277, filed on Jun. 10, 2019, in the Korean Intellectual Property Office, the disclosure of which is incorporated by reference herein in its entirety.

BACKGROUND

The inventive concept relates to a wafer cleaning apparatus, and more particularly, to a wafer cleaning apparatus using light irradiation and a wafer cleaning system including the same.

In various etching processes, e.g., an ion injection process, photolithography, etc., which are included in a manufacturing process of a semiconductor device, residue including, for example, organic substances, may be generated. Accordingly, a cleaning process of removing the residue between intermediate processes of the manufacturing process of the semiconductor device may need to be performed. In the cleaning process, cleaning process conditions for increasing a cleaning efficiency while preventing damage to components such as semiconductor substrates, gate structures, and insulation structures are being studied. Recently, there has been an issue of, for example, pattern leaning in the cleaning process due to a decrease in the design rule due to an increase in the degree of integration of semiconductor devices, and thus, studies are being made to solve the pattern leaning issue.

SUMMARY

The inventive concept provides a wafer cleaning apparatus based on light irradiation capable of effectively cleaning residue on a wafer without damaging the wafer, and a wafer cleaning system including the cleaning apparatus.

According to an aspect of the inventive concept, there is provided a wafer cleaning apparatus configured to clean residue on a wafer by light irradiation including: a light irradiation unit configured to irradiate light onto the wafer during the light irradiation; a wafer processing unit configured to accommodate the wafer and to control a position of the wafer such that the light of an energy set for the wafer is irradiated onto the wafer during the light irradiation; and a cooling unit configured to cool the wafer after the light irradiation has been completed, wherein the light irradiation unit, the wafer processing unit, and the cooling unit are sequentially arranged in a vertical structure with the light irradiation unit above the wafer processing unit and the wafer processing unit above the cooling unit.

According to another aspect of the inventive concept, there is provided a wafer cleaning apparatus based on light irradiation including: a light irradiation unit or system including at least one lamp configured to generate light and a diffusion lens configured to uniformly diffuse the light from the at least one lamp, the light irradiation unit being configured to irradiate the light onto a wafer; a wafer processing unit or system configured to accommodate the wafer and to control a position of the wafer such that the light of an energy set for the wafer is irradiated onto the wafer for a period of time; and a cooling unit or system including a heat exchanger, the cooling unit being configured to cool the wafer after the light has been irradiated onto the wafer for the period of time, wherein isopropyl alcohol (IPA) residue, which remains after a substitution process of the IPA and a $CO_2$ supercritical fluid is performed, is removed by the light being irradiated onto the wafer for the period of time.

According to another aspect of the inventive concept, there is provided a wafer cleaning system including: a first cleaning apparatus configured to clean and dry a wafer using a supercritical fluid; and a second cleaning apparatus configured to clean residue on the wafer by light irradiation after the wafer has been cleaned in the first cleaning apparatus, wherein the second cleaning apparatus includes: a light irradiation unit configured to irradiate light onto the wafer during the light irradiation; a wafer processing unit configured to accommodate the wafer and to control a position of the wafer such that the light of an energy set for the wafer is irradiated onto the wafer during the light irradiation; and a cooling unit configured to cool the wafer after the light irradiation has been completed, wherein the light irradiation unit, the wafer processing unit, and the cooling unit are sequentially arranged in a vertical structure with the light irradiation unit above the wafer processing unit and the wafer processing unit above the cooling unit.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1A:
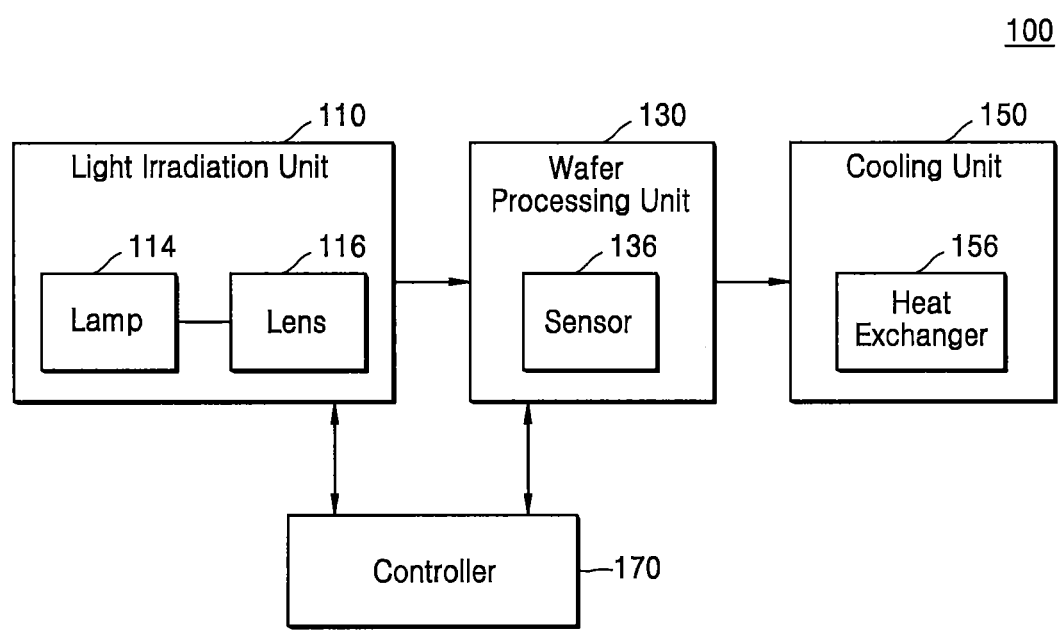
FIGS. 1A and 1B are a block diagram and a schematic structural diagram of a wafer cleaning apparatus based on light irradiation, according to embodiments of the inventive concept, respectively.

Hereinafter, embodiments of the inventive concept will be described in detail with reference to the accompanying drawings. Identical reference numerals are used for the same constituent elements in the drawings, and duplicate descriptions thereof may be omitted in the interest of brevity.

Figure 1B:
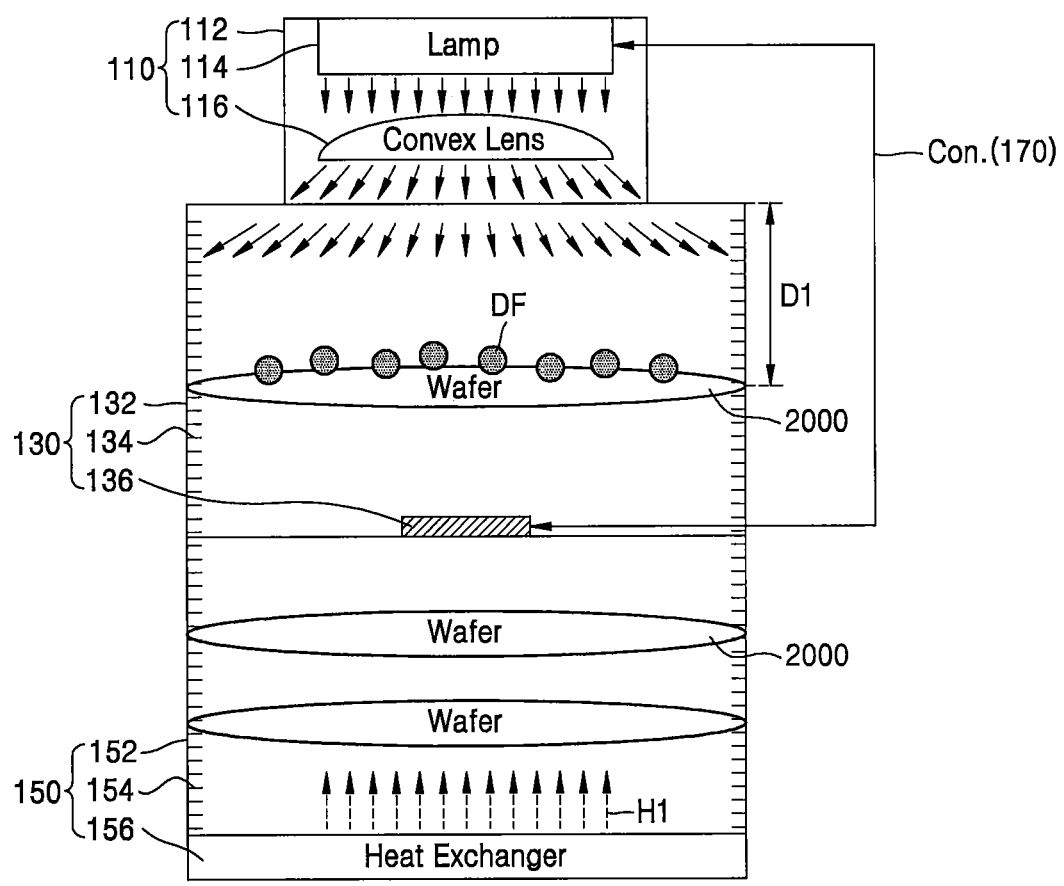

FIGS. 1A and 1B are a block diagram and a schematic structural diagram of a wafer cleaning apparatus based on light irradiation 100 according to embodiments of the inventive concept, respectively.

Referring to FIGS. 1A and 1B, the wafer cleaning apparatus based on light irradiation 100 (hereinafter, 'the wafer cleaning apparatus') according to the present embodiment may include a light irradiation unit or system 110, a wafer processing unit or system 130, a cooling unit or system 150, and a controller 170.

The light irradiation unit 110 may generate light and irradiate the light onto a wafer 2000 in the wafer processing unit 130. The light irradiation unit 110 may include a lamp 114 for generating and outputting light, a diffusion lens 116 for uniformly diffusing the light from the lamp 114, and a first body 112 accommodating the lamp 114 and the diffusion lens 116. For reference, in the block diagram of FIG. 1A, the first body 112 is omitted. In addition, a second body 132 and a third body 152, and a first slot 134 and a second slot 154, which are described below, are also omitted in the block diagram of FIG. 1A.

The lamp 114 may generate and output broadband light. For example, the lamp 114 may generate and output broadband light such as an ultraviolet (UV) ray, an extreme ultraviolet (EUV) ray, an infrared (IR) ray, etc. For example, the lamp 114 may include a flash lamp, which may be referred to as an arc lamp. The flash lamp may emit light of broad wavelengths in a short time. Of course, the lamp 114 is not limited to a flash lamp.

One or a plurality of lamps 114 may be in the first body 112. In addition, the lamp 114 may include cooling tools for removing heat generated by the light irradiation unit 110 or the lamp 114. For example, the lamp 114 may include cooling devices such as a water-cooling type device using water, an air-cooling type device using air, or a water/air-cooling type device using both the water-cooling type device and the air-cooling type device.

The diffusion lens 116 may diffuse the light output from the lamp 114 and may uniformly irradiate the light onto a top surface of the wafer 2000. The diffusion lens 116 may include, for example, a convex lens (e.g., convex relative to the lamp 114). However, the diffusion lens 116 is not limited to a convex lens. For example, according to an embodiment, the diffusion lens 116 may include a concave lens or another optical element of the same function.

The first body 112 may accommodate the lamp 114 and the diffusion lens 116. The first body 112 may seal an inner space of the light irradiation unit 110 from the outside. According to an embodiment, the first body 112 may include an open type without being sealed. For example, when the entirety of the wafer cleaning apparatus 100 including the light irradiation unit 110 has a structure sealed from the outside, the first body 112 may have an open structure.

Since the light diffused from the diffusion lens 116 is irradiated onto the wafer 2000 in the wafer processing unit 130, a bottom surface of the first body 112 may include a transparent material such as glass. In addition, the bottom surface of the first body 112 may constitute a portion of a top surface of the second body 132 described below. According to an embodiment, the bottom surface of the first body 112 may not be present. In other words, there may be no particular blocking structure between the first body 112 and the second body 132, and the light from the diffusion lens 116 may be directly irradiated through a space onto the wafer 2000 in the wafer processing unit 130.

The wafer processing unit 130 may include a chamber or room in which the wafer 2000 to be cleaned is arranged and light irradiation is performed onto the wafer 2000. The wafer processing unit 130 may include the second body 132 for maintaining a sealed space thereof, the first slot 134 formed in an inner wall of the second body 132, and a sensor or sensor system 136 for measuring a physical quantity or property in the second body 132.

The second body 132 may seal the inner space of the wafer processing unit 130 from the outside. In addition, the second body 132 may include a heat insulating material to block heat transfer from the outside. A structure of the second body 132 may generally have a rectangular parallelepiped structure. However, the structure of the second body 132 is not limited to a rectangular parallelepiped structure. A door that allows for the entering and exiting of the wafer 2000 may be arranged on either side of the second body 132. When the door is open, the wafer 2000 may enter and exit the wafer processing unit 130. When the door is closed, an inner space of the wafer processing unit 130 may be blocked from the outside, and a heat treatment process on the wafer 2000 by the light irradiation may be performed.

The inner space sealed by the second body 132 may include a clean space. For example, an inner space of the second body 132 may include a blow zone to which only $N_2$/clean dryer air (CDA) is supplied, and no other general air is present or supplied.

A plurality of first slots 134 may be formed on the inner wall of the second body 132. The wafer 2000 may be inserted into the first slot 134. As the plurality of first slots 134 are formed, a first distance D1 of the wafer 2000 from the top surface of the second body 132 may be adjusted. In other words, according to a position of the first slot 134 into which the wafer 2000 is inserted, the first distance D1 may be adjusted, and accordingly, a distance between the wafer 2000 and the light irradiation unit 110 may be adjusted, and a light irradiation amount or light energy irradiated onto the wafer 2000 may be controlled.

The sensor 136 may be on the bottom surface of the second body 132. The sensor 136 may measure various physical quantities or properties such as temperature, energy, and damage of the wafer 2000. The physical quantities measured by the sensor 136 may be utilized as feedback data by the controller 170. In other words, the controller 170 may control light generation and the light irradiation amount of the lamp 114 of the light irradiation unit 110, based on the physical quantities obtained from the sensor 136.

In FIG. 1B, the sensor 136 may be arranged on the bottom portion of the second body 132; however, the position of the sensor 136 is not limited thereto. For example, the sensor 136 may be at a position in the second body 132 where the physical quantities required for a measurement are optimally measured. In addition, in FIG. 1B, only one sensor 136 is arranged, but the number of sensors 136 is not limited to one. For example, according to characteristics of the physical quantities or properties required to be measured, a plurality of sensors 136 may be arranged inside the second body 132. In addition, all of the plurality of sensors 136 may include sensors of the same function, or at least one of them may include a sensor of different function.

The wafer cleaning apparatus 100 of the present embodiment may remove a defect DF that is on a top surface of the wafer 2000 in the wafer processing unit 130 due to vaporization due to the light irradiation. In this case, the defect DF may include isopropyl alcohol (IPA) residue.

With respect to a removal of the defect DF on the wafer 2000, a pattern leaning in which the pattern is inclined may become a serious issue, because the design rule decreases as the degree of integration of the semiconductor device increases. It is generally known that the pattern leaning may be caused by an application of surface tension of remaining water in a drying process, after a wet cleaning process.

Accordingly, to improve the pattern leaning that occurs during the drying process, a drying process may proceed in an IPA/CO$_2$ substitution method using de-ionized water (DIW) and a supercritical fluid having a low surface tension such as CO$_2$ supercritical fluid. By using the drying process using supercritical fluid, the issue of pattern leaning may be solved to some extent. However, the IPA residue may be generated due to a poor IPA replacement efficiency in the IPA/CO$_2$ replacement process, and the IPA residue may act as a cause of defects again in subsequent processes.

The wafer cleaning apparatus 100 of the present embodiment may effectively remove the residue on the wafer 2000, for example, the IPA residue in the drying process of the IPA/CO$_2$ replacement method, by performing additional cleaning by using the light irradiation after the cleaning and drying processes for the wafer 2000. Accordingly, the wafer cleaning apparatus 100 of the present embodiment may prevent defects due to the IPA residue in the subsequent processes after the cleaning and drying processes.

In addition, in the wafer cleaning apparatus 100 of the present embodiment, the IPA residue may be effectively removed without damaging the wafer 2000, by selectively heat treating the wafer 2000 for a short period of time by using the light irradiation. For example, in the wafer cleaning apparatus 100 of the present embodiment, the light irradiation for the wafer 2000 may be performed by using the lamp 114 several hundred times in the form of a pulse equal to or less than one millisecond (ms). The temperature of the wafer 2000 may be raised to several hundred degrees Celsius by the heat treatment using the light irradiation. In general, since the IPA is vaporized at about 70° C., it may be seen that the IPA residue on the wafer 2000 may be effectively removed by the heat treatment using the light irradiation.

On the other hand, an application field of the wafer cleaning apparatus 100 of the present embodiment is not limited to a drying process of the IPA/CO$_2$ replacement method. In addition, the defect DF on the wafer 2000 to be removed by the wafer cleaning apparatus 100 of the present embodiment is not limited to IPA residue. For example, the wafer cleaning apparatus 100 of the present embodiment may be applied in various cleaning and drying processes, and the residue that may remain on the wafer 2000 in the corresponding cleaning and drying processes may be removed by the light irradiation.

The cooling unit 150 may include a chamber or a room in which the wafers 2000 having been cleaned by the light irradiation are arranged and cooled. The cooling unit 150 may include the third body 152 for maintaining a sealed space thereof, the second slot 154 formed on an inner wall of the third body 152, and a heat exchanger 156 for cooling the wafers 2000.

The third body 152 may be similar to the second body 132. For example, the third body 152 may seal an inner space of the cooling unit 150 from the outside, and in addition, may include an insulating material for blocking or helping to prevent heat transfer to and from the outside. The third body 152 may also have a rectangular parallelepiped structure, but a structure of the third body 152 is not limited to a rectangular parallelepiped structure. A door allowing for the entering and exiting of the wafer 2000 may be arranged on any one side surface of the third body 152. When the door is open, the wafer 2000 may enter and exit the cooling unit 150. When the door is closed, the internal space of the cooling unit 150 may be blocked from the outside.

The inner space sealed by the third body 152 may also include a clean space. For example, the internal space of the third body 152 may include a blow zone to which N$_2$/CDA is supplied and may not include other general air.

A plurality of second slots 154 may be formed on the inner wall of the third body 152. The wafer 2000 may be inserted into the second slot 154. As the plurality of second slots 154 may be formed, the plurality of wafers 2000 may be arranged inside the third body 152 via the second slots 154 and may be cooled together. Accordingly, a cooling efficiency for the wafers 2000 in the cooling unit 150 may be improved, and an overall cleaning efficiency of the wafer cleaning apparatus 100 may be improved.

The heat treatment for the wafer 2000 by the light irradiation may be performed for several tens of seconds in the wafer processing unit 130, and accordingly, the wafer 2000 may be heated to, for example, about 200° C. to about 400° C. On the other hand, to perform a subsequent process for the wafer 2000, the wafer 2000 may need to be cooled to an ambient temperature of about 25° C. Accordingly, the wafer 2000 may be cooled in the cooling unit 150 for several minutes. When the wafers 2000 are cooled one by one in the cooling unit 150, like in the wafer processing unit 130, the entire cleaning time of the wafer cleaning apparatus 100 may be affected by a cooling time of the cooling unit 150, and thus, may be very long. However, in the wafer cleaning apparatus 100 of the present embodiment, the cooling may be performed according to a processing speed of the wafer processing unit 130, by cooling the plurality of wafers 2000 together in the cooling unit 150. As a result, the total cleaning time of the wafer cleaning apparatus 100 may be substantially shortened. Thus, in the wafer cleaning apparatus 100 of the present embodiment, the cooling efficiency and the cleaning efficiency for the wafers 2000 may be substantially improved.

A method of simultaneously cleaning the plurality of wafers 2000 in the cooling unit 150 is described in more detail with reference to FIGS. 2A through 2E.

A size of the third body 152 may be substantially the same as a size of the second body 132 as illustrated in FIG. 1B. However, the size of the third body 152 may be different from the size of the second body 132. In addition, the number of second slots 154 on the inner wall of the third body 152 may be the same as the number of first slots 134 on the inner wall of the second body 132. However, the number of second slots 154 is not limited thereto and may be different from the number of first slots 134. For example, the number of second slots 154 may be greater than the number of first slots 134.

The heat exchanger 156 may be in a bottom portion of the third body 152. The heat exchanger 156 may include, for example, a cooler. The inner space of the third body 152 may be cooled by the heat exchanger 156, and accordingly, the wafers 2000 arranged in the third body 152 may be cooled. As indicated by a plurality of dashed arrows H1 in FIG. 1B, the heat exchanger 156 may cool the air in the bottom portion of the third body 152, and in addition, may cool the wafers 2000 arranged in the third body 152 through an upward transfer or flow of the cooled air.

In the wafer cleaning apparatus 100 of the present embodiment, the heat exchanger 156 is on the bottom portion of the third body 152, but a location of the heat exchanger 156 is not limited thereto. For example, the heat exchanger 156 may be at a location where the wafers 2000 in the third body 152 are effectively cooled.

As described above, the controller 170 may control the light generation and the light irradiation amount of the lamp 114 of the light irradiation unit 110 based on the physical quantity obtained from the sensor 136 of the wafer processing unit 130. The controller 170 may be provided as a component of the wafer cleaning apparatus 100 of the present embodiment. However, according to an embodiment, the controller 170 may not be provided as a component of the wafer cleaning apparatus 100, and the light generation and light irradiation amount of the lamp 114 of the light irradiation unit 110 may be controlled by using a controller of a wafer cleaning system (refer to FIG. 5) including the wafer cleaning apparatus 100.

The wafer cleaning apparatus 100 of the present embodiment may clean, by the light irradiation, the wafer 2000 arranged in or on the wafer processing unit 130 by using the lamp 114 of the light irradiation unit 110, and in addition, the wafer 2000, which is heated by the light irradiation, may be efficiently cooled in the cooling unit 150. Accordingly, the wafer cleaning apparatus 100 of the present embodiment may prevent a defect in the subsequent processes, by effectively removing the residue on the wafer 2000 without damaging the wafer 2000 by using the light irradiation.

In the wafer cleaning apparatus 100 of the present embodiment, the light irradiation unit 110, the wafer processing unit 130, and the cooling unit 150 may be bonded or otherwise connected and formed in a vertical structure. For example, the wafer cleaning apparatus 100 of the present embodiment may have a structure in which the light irradiation unit 110, the wafer processing unit 130, and the cooling unit 150 are sequentially arranged from above and bonded or otherwise connected to each other. By using the vertical structure, the wafer cleaning apparatus 100 of the present embodiment may be compact and may be easily installed or mounted at a required location of the wafer cleaning system (refer to FIG. 5). In addition, based on the vertical structure of the wafer cleaning apparatus 100, a first transfer robot (refer to 300-1 in FIG. 5) of a wafer cleaning system 1000 may more easily transfer the wafer 2000 to the wafer processing unit 130 and from the wafer processing unit 130 to the cooling unit 150.

FIGS. 2A through 2E are conceptual diagrams illustrating processes of moving the wafers 2000 into/from the cooling unit 150 in the wafer cleaning apparatus of FIG. 1A, respectively. The descriptions already given with reference to FIGS. 1A and 1B may be briefly provided or omitted in the interest of brevity.

Figure 2A:
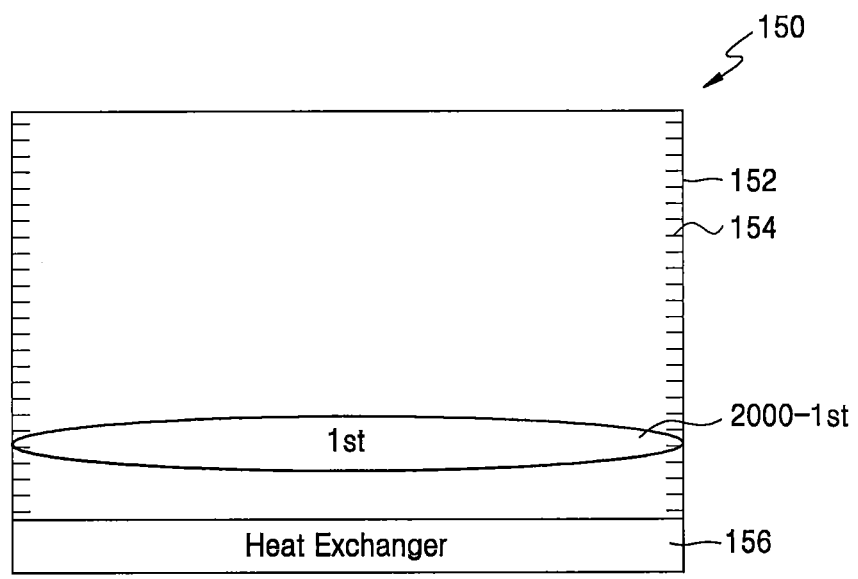
FIGS. 2A through 2E are conceptual diagrams illustrating processes of transferring wafers into/from a cooling unit in a wafer cleaning apparatus based on light irradiation of FIG. 1A.
Figure 5:
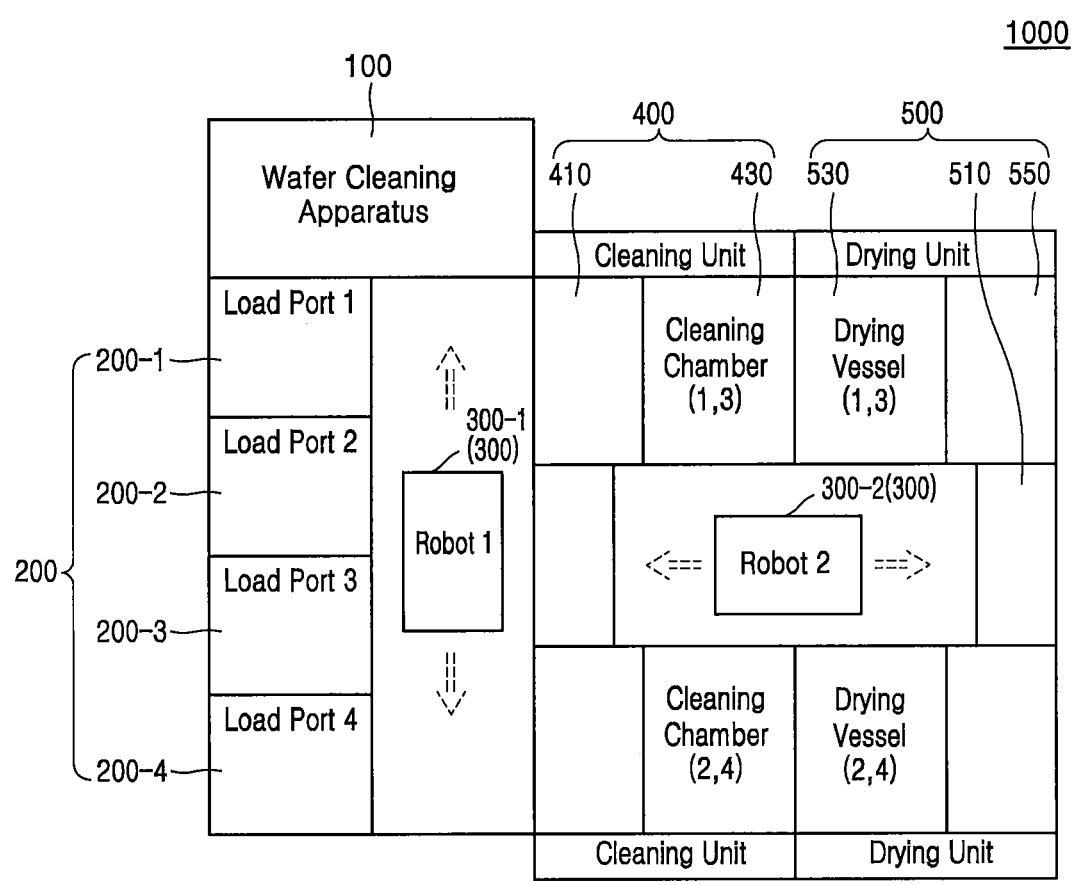
FIG. 5 is a schematic structural diagram of a wafer cleaning system, according to an embodiment of the inventive concept.

Referring to FIG. 2A, first, a first wafer 2000-1st may be stored in the cooling unit 150 by a transfer robot (refer to 300-1 in FIG. 5). The first wafer 2000-1st may include a wafer that has been cleaned by the light irradiation in a wafer processing unit (refer to 130 in FIG. 1B). In addition, the first wafer 2000-1st may be or include a wafer on which main cleaning and drying processes have been performed, before the cleaning process by the light irradiation. In this case, the main cleaning and drying processes may include a wet cleaning process and a drying process using supercritical fluid. However, the main cleaning and drying processes are not limited to a wet cleaning process and a drying process using supercritical fluid. The first wafer 2000-1st may be cooled immediately from a moment the first wafer 2000-1st is stored in the cooling unit 150.

Figure 2B:
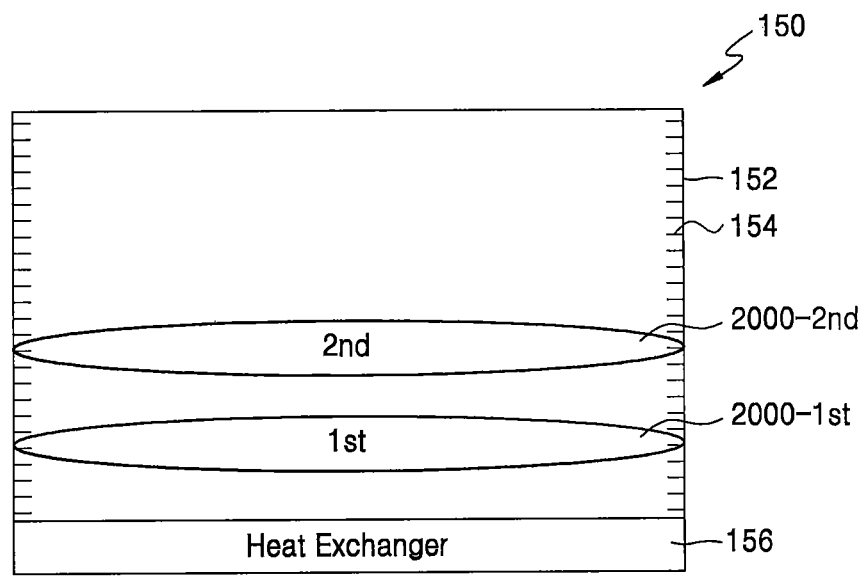

Referring to FIG. 2B, a second wafer 2000-2nd may be stored in the cooling unit 150 by the transfer robot. The second wafer 2000-2nd may also be or include a wafer on which the main cleaning and drying processes have been performed and the cleaning process by the light irradiation has been performed in the wafer processing unit 130. The second wafer 2000-2nd may be cooled immediately from a moment the second wafer 2000-2nd is stored in the cooling unit 150. Meanwhile, cooling of the first wafer 2000-1st in the cooling unit 150 may be continued.

Figure 2C:
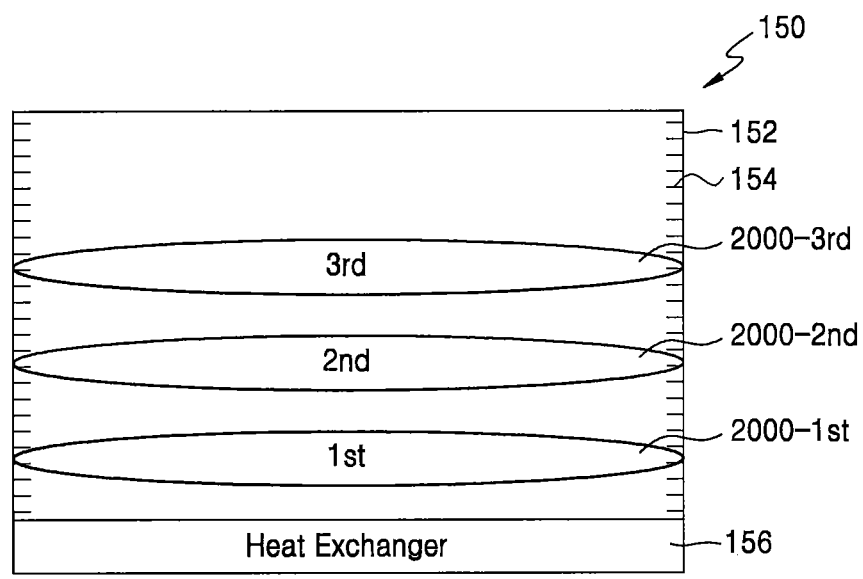

Referring to FIG. 2C, a third wafer 2000-3rd may be stored in the cooling unit 150 by the transfer robot. The third wafer 2000-3rd may also be or include a wafer on which the main cleaning and drying processes have been performed and the cleaning process by the light irradiation has been performed in the wafer processing unit 130. The third wafer 2000-3rd may be cooled immediately from a moment the third wafer 2000-3rd is stored in the cooling unit 150. Meanwhile, the cooling of the first wafer 2000-1st and the second wafer 2000-2nd in the cooling unit 150 may be continued.

Figure 2D:
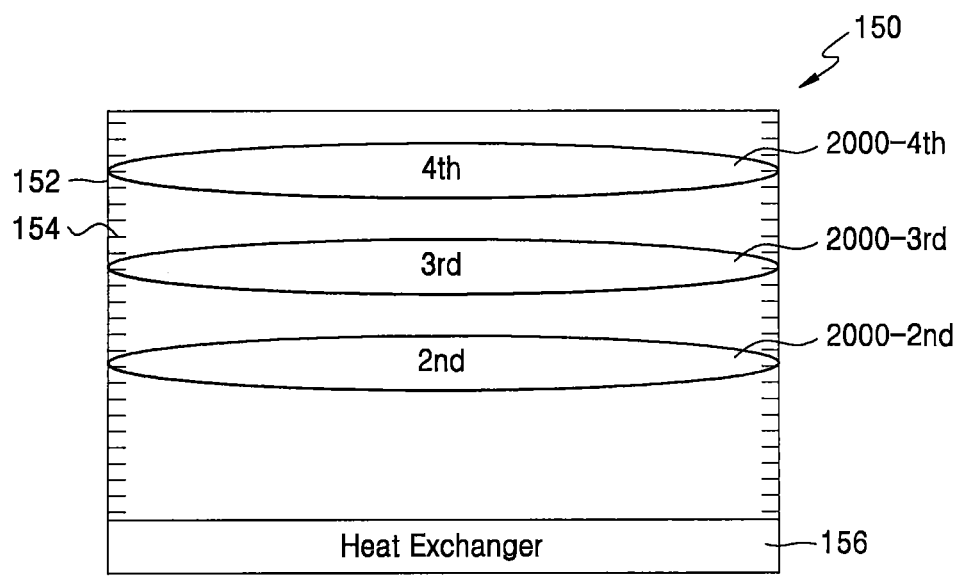

Referring to FIG. 2D, a fourth wafer 2000-4th may be stored in the cooling unit 150 by the transfer robot. The fourth wafer 2000-4th may also include a wafer on which the main cleaning and drying processes have been performed and the cleaning process by the light irradiation has been performed in the wafer processing unit 130.

On the other hand, before or after storing of the fourth wafer 2000-4th into the cooling unit 150, the first wafer 2000-1st may be retrieved from the cooling unit 150 by the transfer robot. The first wafer 2000-1st may be in a state where the first wafer 2000-1st has been cooled to a required temperature condition. For example, the first wafer 2000-1st may be in a state where the first wafer 2000-1st has been cooled to the ambient temperature level.

As may be seen in FIG. 2D, the fourth wafer 2000-4th may be arranged in the second slot 154 at a different location from the second slot 154 in which the first wafer 2000-1st has been arranged. However, according to an embodiment, the fourth wafer 2000-4th may be arranged in the same second slot 154 as the second slot 154 in which the first wafer 2000-1st had been arranged. In other words, after the first wafer 2000-1st is retrieved, the fourth wafer 2000-4th may be arranged in the second slot 154 in which the first wafer 2000-1st had been arranged. As described above, when a wafer is transferred in and out in a manner that a new wafer is arranged in the second slot 154 where an old wafer had been transferred out, a space utilization of the cooling unit 150 may be improved.

The fourth wafer 2000-4th may be cooled immediately from a moment the fourth wafer 2000-4th is stored in the cooling unit 150. Meanwhile, the cooling of the second wafer 2000-2nd and the third wafer 2000-3rd in the cooling unit 150 may be continued.

Figure 2E:
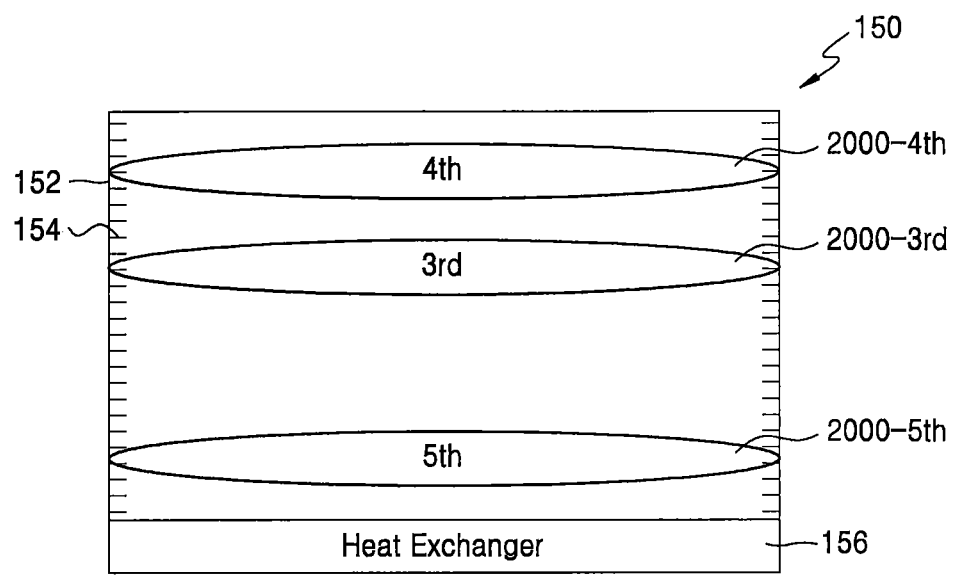

Referring to FIG. 2E, a fifth wafer 2000-5th may be stored in the cooling unit 150 by the transfer robot. The fifth wafer 2000-5th may also be or include a wafer on which the main cleaning and drying processes have been performed and the cleaning process by the light irradiation has been performed in the wafer processing unit 130.

On the other hand, before or after storing of the fifth wafer 2000-5th into the cooling unit 150, the second wafer 2000-2nd may be retrieved from the cooling unit 150 by the transfer robot. The second wafer 2000-2nd may be in a state where the second wafer 2000-2nd has been cooled to a required temperature condition.

As may be seen in FIG. 2E, the fifth wafer 2000-5th may be arranged in the second slot 154 in which the first wafer 2000-1st had been arranged. However, according to an embodiment, the fifth wafer 2000-5th may be arranged in the second slot 154 in which the second wafer 2000-2nd had been arranged. In other words, as described above, when a wafer is transferred in and out in a manner that a new wafer is arranged in the second slot 154 where the old wafer has been transferred out, after the second wafer 2000-2nd is transferred out, the fifth wafer 2000-5th may be arranged in the second slot 154 in which the second wafer 2000-2nd had been arranged.

The fifth wafer 2000-5th may be cooled immediately from a moment the fifth wafer 2000-5th is stored in the cooling unit 150. Meanwhile, the cooling of the third wafer 2000-3rd and the fourth wafer 2000-4th in the cooling unit 150 may be continued.

Thereafter, the cooling may be performed on the wafers 2000 which have been cleaned by the light irradiation through the processes described above. Although, in the embodiments in FIGS. 2A through 2E, three of the wafers 2000 are cooled together in the cooling unit 150, the number of wafers 2000 to be cooled in the cooling unit 150 is not limited to three. For example, two or more than four wafers 2000 may be cooled together in the cooling unit 150. In addition, as described above, when a wafer is transferred in and out in a manner that a new wafer is arranged in the second slot 154 where the old wafer has been transferred out, one of the wafers 2000 may be further arranged to be cooled in the cooling unit 150, compared with the case where a wafer is transferred in and out in a manner described with reference to FIGS. 2A through 2E.

Figure 3A:
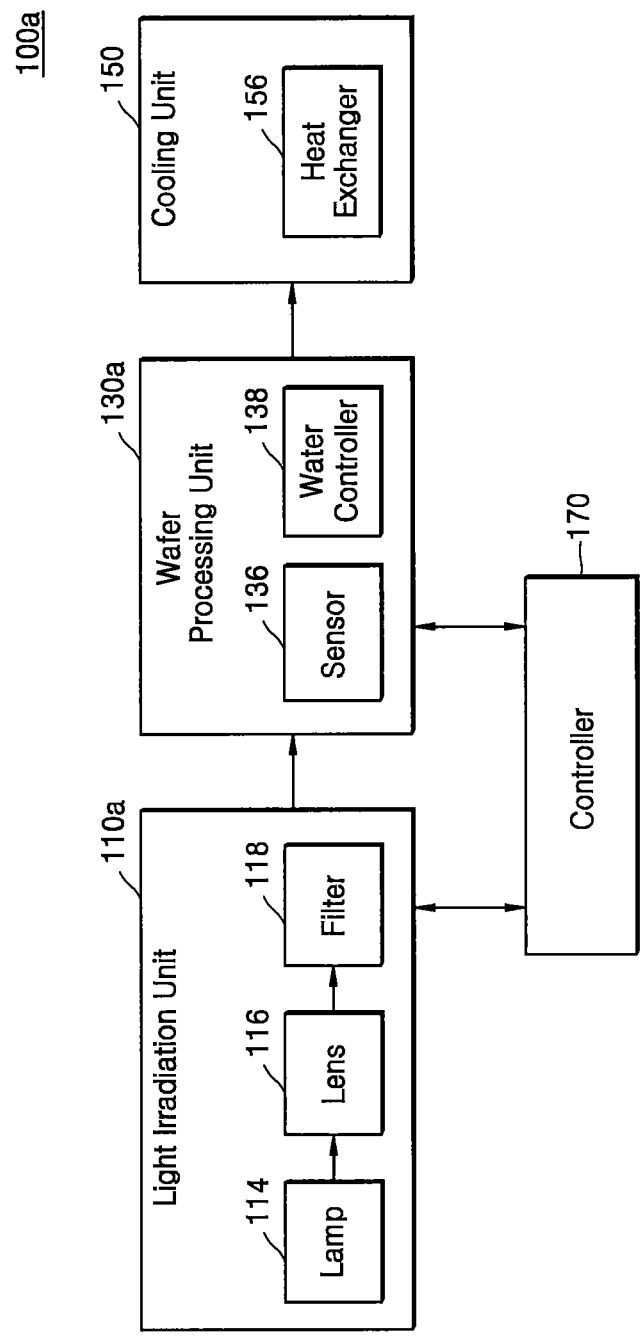
FIGS. 3A and 3B are a block diagram and a schematic structural diagram of a wafer cleaning apparatus based on light irradiation, according to embodiments of the inventive concept, respectively.
Figure 3B:
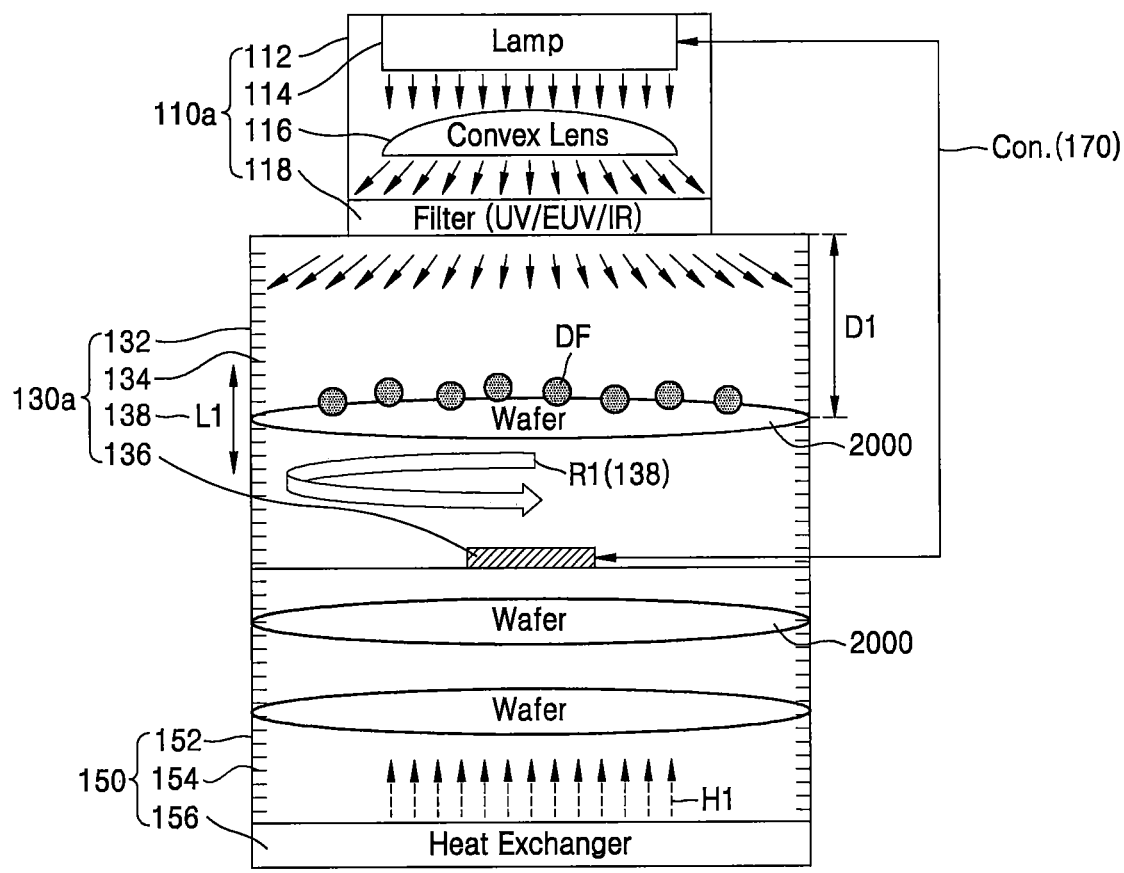

FIGS. 3A and 3B are a block diagram and a schematic structural diagram of a wafer cleaning apparatus 100a, according to embodiments of the inventive concept, respectively. The descriptions already described with reference to FIGS. 1A through 2E may be briefly provided or omitted in the interest of brevity.

Referring to FIGS. 3A and 3B, the wafer cleaning apparatus 100a of the present embodiment may be different from the wafer cleaning apparatus 100 of FIGS. 1A and 1B, with respect to components of a light irradiation unit 110a and a wafer processing unit 130a. In the wafer cleaning apparatus 100a of the present embodiment, the light irradiation unit 110a may include the first body 112, the lamp 114, the diffusion lens 116, and a filter 118. Descriptions of the first body 112, the lamp 114, and the diffusion lens 116 may be the same as those given with reference to the wafer cleaning apparatus 100 of FIGS. 1A and 1B. Similar to the block diagram of FIG. 1A, in the block diagram of FIG. 3A, the first body 112, the second body 132, the third body 152, the first slot 134, and the second slot 154 are omitted.

The filter 118 may pass only light of a required band and block light of the other bands. In other words, the filter 118 may transmit only light of a particular band from broadband light that comes from the diffusion lens 116 and may irradiate the light of the particular band onto the wafer 2000 in the wafer processing unit 130a. In this manner, by irradiating only the light of the desired or required band to the wafer 2000 by using the filter 118, damage to the wafer 2000 may be reduced while high heat treatment efficiency for the wafer 2000 is maintained. When the light from the diffusion lens 116 is broadband light including the UV light, the EUV light, and the IR light, the filter 118 may transmit only one of the UV light, the EUV light, and the IR light, for example, the IR light, and irradiate the IR light onto the wafer 2000.

The filter 118 may be on a bottom portion of the first body 112 and constitute the bottom surface of the first body 112. The filter 118 may be detachably attached or connected to the first body 112. For example, an insertion groove into which the filter 118 is inserted may be formed on the bottom surface portion of the first body 112. The filter 118 may be inserted into the insertion groove and mounted on the first body 112. In the wafer cleaning apparatus 100a of the present embodiment, since the filter 118 is detachably attached to the first body 112, various types of filters 118 may be changed and mounted on the first body 112 according to desired or required light transmission characteristics.

On the other hand, in the wafer cleaning apparatus 100a of the present embodiment, the filter 118 may not be mounted on the first body 112. In this case, the light irradiation unit 110a may function substantially the same as the light irradiation unit 110 of the wafer cleaning apparatus 100 of FIGS. 1A and 1B.

The wafer processing unit 130a may include the second body 132, the first slot 134, the sensor 136, and a wafer adjusting device 138. Descriptions of the second body 132, the first slot 134, and the sensor 136 may be the same as those given with reference to the wafer cleaning apparatus 100 of FIGS. 1A and 1B.

The wafer adjusting device 138 may adjust a location or orientation of the wafer 2000 inside the second body 132. For example, the wafer adjusting device 138 may rotate the wafer 2000 as indicated by a curved arrow R1. By rotating the wafer 2000 by using the wafer adjusting device 138, light from the light irradiation unit 110a may be uniformly irradiated onto the wafer 2000. Accordingly, the residue on the wafer 2000 may be optimally removed. In spite of the presence of the diffusion lens 116 of the light irradiation unit 110a, light may be irradiated unevenly onto the wafer 2000 depending on regions thereof for various reasons. In this case, by compensating for a non-uniform light irradiation by rotating the wafer 2000 using the wafer adjusting device 138, the light may be uniformly irradiated onto the wafer 2000.

On the other hand, the wafer adjusting device 138 may move the wafer 2000 in a vertical direction, as indicated by a straight arrow L1. By moving the wafer 2000 in the vertical direction by using the wafer adjusting device 138, the first distance D1 of the wafer 2000 from the top surface of the second body 132 may be adjusted. Accordingly, the light irradiation amount or light energy irradiated onto the wafer 2000 may be adjusted.

The wafer adjusting device 138 may include, for example, a flat plate on which the wafer 2000 is placed, and a support pillar which supports, rotates, and vertically moves the flat plate. A flat plate portion of the wafer adjusting device 138 may have a circular shape like the wafer 2000, but is not limited thereto. In addition, considering a function of the wafer adjusting device 138, an area of the flat plate portion may be less than an area of the wafer 2000.

Further, in the description of the wafer cleaning apparatus 100 of FIGS. 1A and 1B, it is stated that the first distance D1 is adjustable depending on the location of the wafer 2000 in the first slot 134. The adjustment of the first distance D1 by using the first slot 134 may be performed when the wafer 2000 is accommodated in the second body 132. After the wafer 2000 is already accommodated in the second body 132, a process of retrieving the wafer 2000 from the second body 132 and storing the wafer 2000 again in the first slot 134 at another location for the adjustment of the first distance D1 may be troublesome and may cause time loss.

To solve this issue, a relatively small number of first slots 134 having a relatively wide spacing may be arranged in the second body 132, and the wafer 2000 may be moved in the vertical direction by the wafer adjusting device 138 within a range of the spacing between the first slots 134. In other words, when the wafer 2000 is accommodated in the second body 132, the first distance D1 may be broadly adjusted by using the first slot 134. After the wafer 2000 is accommodated in the second body 132, the first distance D1 may be more precisely adjusted, by moving the wafer 2000 in the vertical direction within the range of the spacing between the first slots 134 using the wafer adjusting device 138, without having to retrieve the wafer 2000 from the second body 132. In this manner, by utilizing the wafer adjusting device 138 to adjust the first distance D1, the issue of the adjustment of the first distance D1 by using only the first slot 134 may be solved. In addition, since the wafer adjusting device 138 adjusts the first distance D1 in the vertical direction, according to an embodiment, the first slot 134 in the second body 132 may be omitted.

Figure 4:
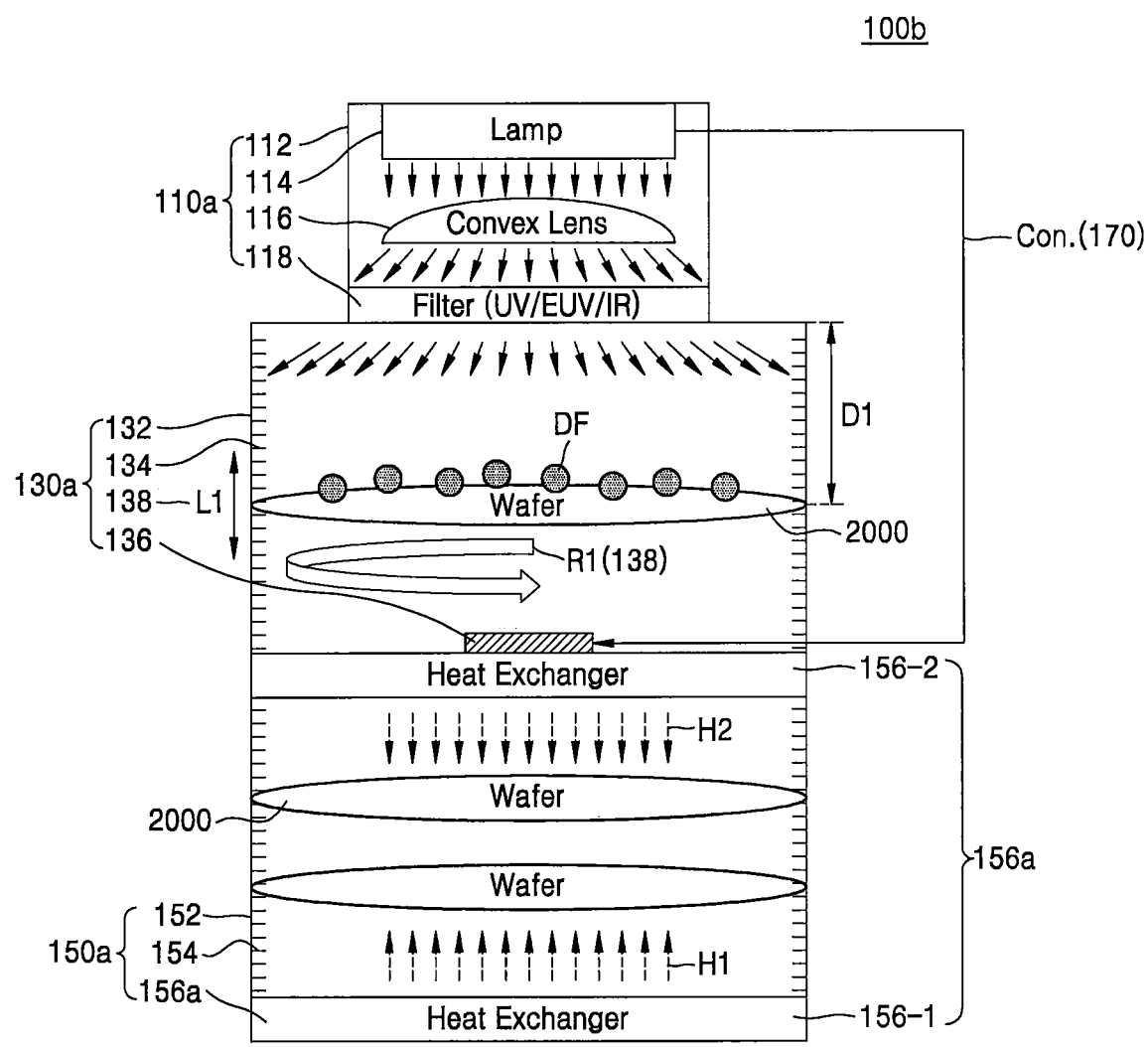
FIG. 4 is a schematic structural diagram of a wafer cleaning apparatus based on light irradiation, according to an embodiment of the inventive concept.

FIG. 4 is a schematic structural diagram of a wafer cleaning apparatus 100b, according to an embodiment of the inventive concept, and may correspond to FIG. 1B. The descriptions already given with reference to FIGS. 1A through 3B may be briefly provided or omitted in the interest of brevity.

Referring to FIG. 4, the wafer cleaning apparatus 100b of the present embodiment may be different from the wafer cleaning apparatus 100a of FIGS. 3A and 3B with respect to a configuration of a cooling unit 150a. In the wafer cleaning apparatus 100b of the present embodiment, the cooling unit 150a may include the third body 152, the second slot 154, and a heat exchanger 156a. Descriptions of the third body 152 and the second slot 154 may be the same as those given with reference to the wafer cleaning apparatus 100 of FIGS. 1A and 1B.

The heat exchanger 156a may include a first cooler 156-1 and a second cooler 156-2. The first cooler 156-1 may be in the bottom portion of the third body 152, and the second cooler 156-2 may be in a top portion of the third body 152. The first cooler 156-1 may perform substantially the same function as the heat exchanger 156 of the cooling unit 150 in the wafer cleaning apparatus 100 of FIGS. 1A and 1B.

The second cooler 156-2 may be in the top portion of the third body 152, cool the air in the top portion of the third body 152, and force or move the air downwardly as indicated by a plurality of arrows H2. By arranging the second cooler 156-2 on the top portion of the third body 152 in this manner, cooling efficiency of the cooling unit 150a may be further improved.

As illustrated in FIG. 4, the second cooler 156-2 may be between the second body 132 and the third body 152. Accordingly, according to the embodiment, the second cooler 156-2 may cool the bottom portion of the wafer 2000 of the wafer processing unit 130 by cooling the bottom portion of the second body 132, and thus, may help cool the wafer 2000 in the cooling unit 150a. The residue to be removed by the light irradiation in the wafer processing unit 130a may include the defect DF on the top surface of the wafer 2000. On the other hand, there may be no residue on the bottom surface of the wafer 2000, and since there is no need to remove the residue even when the residue is present, the bottom portion of the wafer 2000 may not need to be heated. Thus, by cooling the bottom portion of the second body 132 under the wafer 2000 to some extent by using the second cooler 156-2, when the wafer 2000 is subsequently cooled in the cooling unit 150a, the cooling efficiency may be improved.

On the other hand, according to an embodiment, when cooling the bottom portion inside the second body 132 is not required or prohibited, a heat insulating material may be arranged between the second body 132 and the third body 152, and the second cooler 156-2 may be beneath the heat insulating material.

In the wafer cleaning apparatus 100b of the present embodiment, the heat exchanger 156a of the cooling unit 150a may include two coolers (156-1 and 156-2), but the number of coolers of the heat exchanger 156a may not be limited to two. For example, in the wafer cleaning apparatus 100b of the present embodiment, the heat exchanger 156a of the cooling unit 150a may include three or more coolers, and each cooler may be arranged at a location including a location on a side surface of the third body 152, etc., where the wafer 2000 may be cooled more effectively.

FIG. 5 is a schematic structural diagram of a wafer cleaning system 1000, according to an embodiment of the inventive concept. The descriptions already described in the descriptions given with reference to FIGS. 1A through 4 may be briefly provided or omitted in the interest of brevity.

Referring to FIG. 5, the wafer cleaning system 1000 may include the wafer cleaning apparatus 100, a load port unit or system 200, a wafer transfer robot 300, a cleaning unit or system 400, and a drying unit or system 500.

The wafer cleaning apparatus 100 may include a wafer cleaning apparatus based on light irradiation. For example, the wafer cleaning apparatus 100 may include the wafer cleaning apparatus 100 of FIG. 1A. Of course, the wafer cleaning apparatus 100 is not limited to the wafer cleaning apparatus 100 of FIGS. 1A and 1B. For example, the wafer cleaning apparatus 100 may include the wafer cleaning apparatus (100a or 100b) of FIG. 3A (and FIG. 3B) or 4, respectively. The wafer cleaning apparatus 100 may be mounted, as a separate apparatus, on a side surface of an equipment front end module (EFEM) of the wafer cleaning system 1000. In this case, the EFEM may include a module for transferring the wafer into and out of the wafer cleaning system 1000. For example, the EFEM may transfer the wafer in the outside into the cleaning unit 400 and transfer the wafer from the drying unit 500 to the outside. The EFEM may correspond to, for example, a portion where the load port unit 200 and a first transfer robot 300-1 are arranged.

The load port unit 200 may include a plurality of load ports (200-1 through 200-4) which are waiting before the wafers to be cleaned are loaded into the cleaning unit 400. The load port unit 200 may include, for example, four load ports (200-1 through 200-4) as illustrated in FIG. 5. However, the number of load ports of the load port unit 200 is not limited to four. According to an embodiment, the load port unit 200 may include three or less or five or more load ports.

The wafer transfer robot 300 may include a first transfer robot 300-1 and a second transfer robot 300-2. The first transfer robot 300-1 may transfer the wafers in respective load ports of the load port unit 200 to the cleaning unit 400. In FIG. 5, one first transfer robot 300-1 is shown, but the number of first transfer robots 300-1 is not limited to one.

The second transfer robot 300-2 may transfer the wafers from the cleaning unit 400 and the drying unit 500. In FIG. 5, one second transfer robot 300-2 is shown, but the number of second transfer robots 300-2 is not limited to one. For example, the second transfer robot 300-2 may include a robot for transferring the wafers inside the cleaning unit 400 and a robot for transferring the wafers inside the drying unit 500.

The cleaning unit 400 may include a distribution box 410 and a cleaning chamber 430. The wafers transferred from the load port unit 200 may wait or be stored in the distribution box 410, and may then be transferred into the cleaning chamber 430 by the second transfer robot 300-2. In the cleaning chamber 430, cleaning of the wafers, for example, a wet cleaning may be performed.

The drying unit 500 may include a pneumatic utility or system 510, a drying vessel 530, and a control box or drying controller 550. The pneumatic utility 510 may adjust pneumatic pressure of the drying unit 500. In the drying vessel 530, drying of the wafers may be performed. The wafers which are dried in the drying unit 500 may include the wafers that have been cleaned in the cleaning unit 400, and may be transferred from the cleaning unit 400 to the drying vessel 530 by the second transfer robot 300-2. The drying vessel 530 may include a supercritical vessel using a supercritical fluid. For example, the wafers may be dried by using a $CO_2$ supercritical fluid in the drying vessel 530. Of course, the drying vessel 530 is not limited to a supercritical vessel.

The control box 550 may control process conditions required in a drying process. For example, the control box 550 may control an amount of electricity, gas input, etc. in the drying process.

For reference, in FIG. 5, numbers in parentheses associated with the cleaning chamber 430 and the drying vessel 530 may refer to numbers of the cleaning chamber 430 and the drying vessel 530, respectively. In other words, the cleaning unit 400 may include a plurality of cleaning chambers 430, and the drying unit 500 may include a plurality of drying vessels 530. In the wafer cleaning system 1000 of the present embodiment, the time period of the drying process may be greater than the time period of a cleaning process. Accordingly, for a smooth process progress, the number of drying vessels 530 may be greater than the number of cleaning chambers 430. However, according to an embodiment, the number of drying vessels 530 and the number of cleaning chambers 430 may be the same.

In the wafer cleaning system 1000 of the present embodiment, the main cleaning and drying processes for the wafers may be performed by using the load port unit 200, the wafer transfer robot 300, the cleaning unit 400, and the drying unit 500. The wafer cleaning apparatus 100 may perform additional cleaning by using the heat treatment using the light irradiation to the wafers that have completed the main cleaning and drying processes. Below, in the descriptions with reference to FIG. 6, the overall cleaning and drying processes of the wafers in the wafer cleaning system 1000 of the present embodiment are described in more detail.

Figure 6:
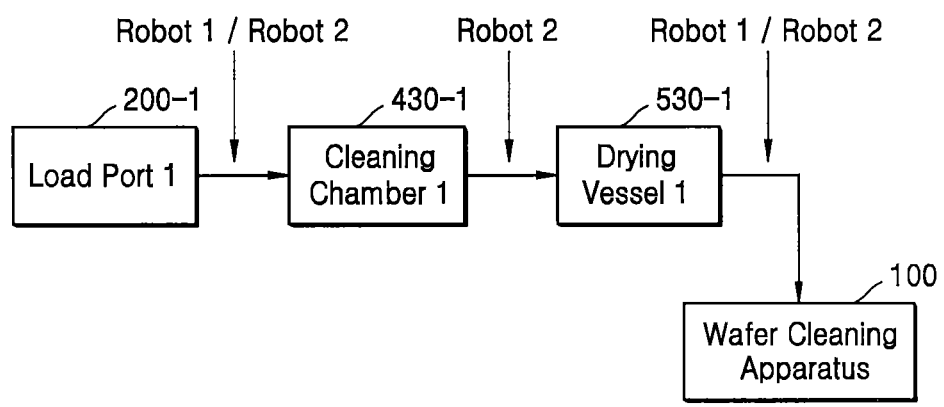
FIG. 6 is a conceptual diagram of cleaning and drying processes of wafers in the wafer cleaning system of FIG. 5.

FIG. 6 is a conceptual diagram of the entire cleaning and drying processes of the wafers in the wafer cleaning system 1000 of FIG. 5. Descriptions are given with reference to FIG. 5 together, and the descriptions already described with reference to FIGS. 1A through 5 may be briefly provided or omitted in the interest of brevity.

Referring to FIG. 6, first of all, the wafer may be transferred from a first load port 200-1 to a first cleaning chamber 430-1 by the first transfer robot 300-1/the second transfer robot 300-2. The wafer may be transferred into the first cleaning chamber 430-1 via the distribution box 410. The wafer that has been cleaned in the first cleaning chamber 430-1 may be transferred into a first drying vessel 530-1 by the second transfer robot 300-2. Thereafter, the wafer that has been dried in the first drying vessel 530-1 may be transferred to the EFEM by the first transfer robot 300-1/the second transfer robot 300-2, and may be transferred to the wafer cleaning apparatus 100. The wafer that has been further cleaned by the light irradiation in the wafer cleaning apparatus 100 may be discharged to the outside of the wafer cleaning system 1000 by the first transfer robot 300-1.

In FIG. 6, a sequence of performing the main cleaning and drying processes for the wafer is described by utilizing the first load port 200-1, the first cleaning chamber 430-1, and the first drying vessel 530-1. However, it goes without saying that the main cleaning and drying processes for the wafer may be performed by utilizing other load ports, other cleaning chambers, and other drying vessels.

Figure 7:
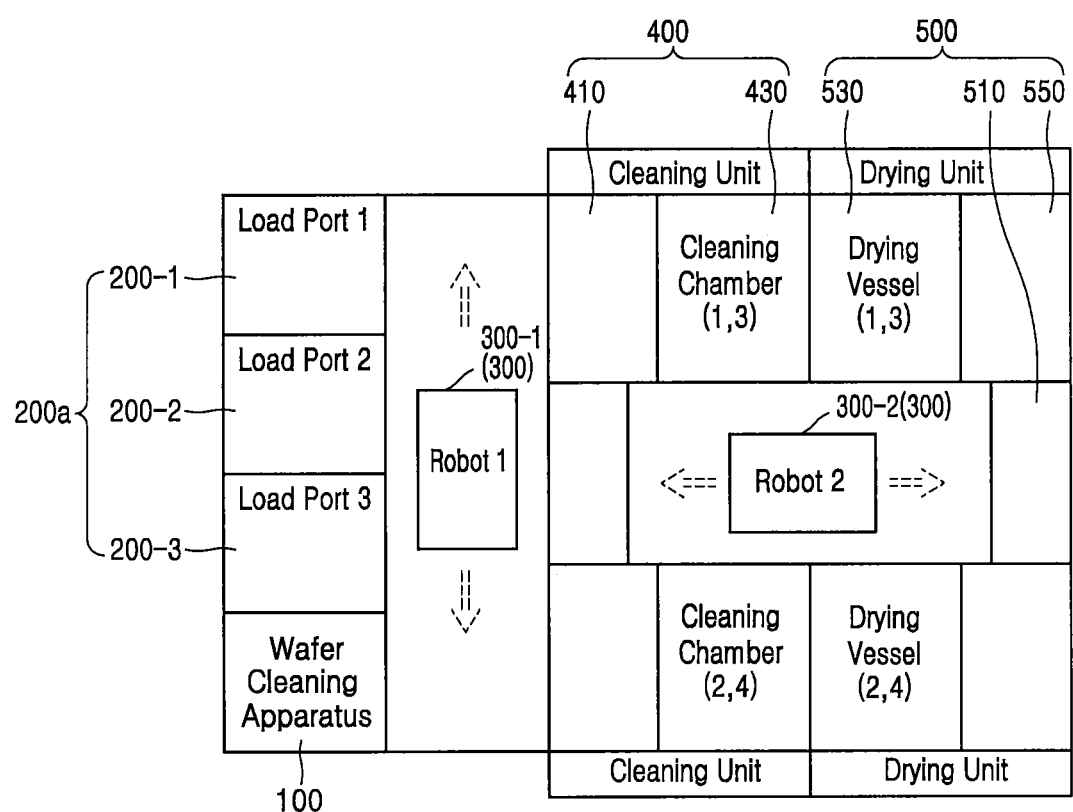
FIG. 7 is a schematic structural diagram of a wafer cleaning system, according to an embodiment of the inventive concept.

FIG. 7 is a schematic structural diagram of a wafer cleaning system 1000a, according to an embodiment of the inventive concept. The descriptions already given with reference to FIGS. 5 and 6 may be briefly provided or omitted in the interest of brevity.

Referring to FIG. 7, the wafer cleaning system 1000a of the present embodiment may be different from the wafer cleaning system 1000 of FIG. 5 with respect to the location of the wafer cleaning apparatus 100. In the wafer cleaning system 1000a of the present embodiment, the wafer cleaning apparatus 100 may be mounted as a plug-in type in any one of the four load ports (200-1 through 200-4) or any of the load port locations of the load port unit 200 of the wafer cleaning system 1000 of FIG. 5, for example, in the fourth load port 200-4. Accordingly, in the wafer cleaning system 1000a of the present embodiment, the load port unit 200a may include only three load ports (200-1 through 200-3).

In this manner, by mounting the wafer cleaning apparatus 100 inside the load port of the wafer cleaning system 1000a, the wafer cleaning system 1000a may not need an additional space for the wafer cleaning apparatus 100. Thus, the wafer cleaning system 1000a of the present embodiment may be easily implemented by using an existing wafer cleaning system including a plurality of load ports.

In the wafer cleaning system 1000a of the present embodiment in which the wafer cleaning apparatus 100 is arranged in the load port, the overall cleaning and drying processes for the wafer may be performed through substantially the same sequence as illustrated in FIG. 6. For example, the wafer may go through the main cleaning and drying processes via the first load port 200-1, the first cleaning chamber 430-1, and the first drying vessel 530-1, and thereafter, the wafer may be transferred into the wafer cleaning apparatus 100 arranged inside the load port by the first transfer robot 300-1 and the second transfer robot 300-2. An additional cleaning of the wafer may be performed by the light irradiation in the wafer cleaning apparatus 100, and thereafter, the wafer in which the additional cleaning by the light irradiation is completed may be transferred to the outside of the wafer cleaning system 1000a by the first transfer robot 300-1.

While the inventive concept has been particularly shown and described with reference to embodiments thereof, it will be understood that various changes in form and details may be made therein without departing from the spirit and scope of the following claims.

What is claimed is:

1. A wafer cleaning apparatus configured to clean residue on a wafer by light irradiation, the wafer cleaning apparatus comprising:
   a light irradiation unit configured to irradiate light onto the wafer during the light irradiation;
   a wafer processing unit configured to accommodate the wafer and to control a position of the wafer such that the light is irradiated onto the wafer during the light irradiation; and
   a cooling unit configured to cool the wafer after the light irradiation has been completed,
   wherein the light irradiation unit, the wafer processing unit, and the cooling unit are sequentially arranged in a vertical structure with the light irradiation unit above the wafer processing unit and the wafer processing unit above the cooling unit,
   the wafer processing unit comprises a first body and the cooling unit comprises a second body, and
   a plurality of slots are defined in the second body and configured to hold the wafer in a plurality of different vertical positions in horizontal orientations in an internal space of the second body.

2. The wafer cleaning apparatus of claim 1,
wherein the wafer cleaning apparatus is configured to, using the light irradiation, clean the residue on the wafer after a drying process for the wafer has been performed using a supercritical fluid.

3. The wafer cleaning apparatus of claim 2,
wherein the supercritical fluid comprises a $CO_2$ supercritical fluid, and
the light irradiation is carried out to remove isopropyl alcohol (IPA) residue that remains on the wafer after a substitution process of the IPA and the $CO_2$ supercritical fluid is performed.

4. The wafer cleaning apparatus of claim 1,
wherein the light irradiation unit comprises at least one lamp configured to generate the light and a diffusion lens configured to uniformly diffuse the light from the at least one lamp.

5. The wafer cleaning apparatus of claim 4,
wherein the light irradiation unit comprises a filter configured to transmit the light corresponding to a particular wavelength region.

6. The wafer cleaning apparatus of claim 1,
wherein the light irradiation unit comprises a lamp configured to generate the light, and
the wafer processing unit is configured to control a rotation of the wafer and a distance of the wafer from the lamp.

7. The wafer cleaning apparatus of claim 1,
wherein the wafer processing unit comprises at least one sensor in an internal space of the first body, and
the wafer cleaning apparatus further comprises a controller configured to control an amount of the light irradiated based on at least one physical property measured by the at least one sensor.

8. The wafer cleaning apparatus of claim 1,
wherein the cooling unit comprises at least one heat exchanger in the second body, and
the at least one heat exchanger comprises: a first heat exchanger at a bottom portion of the second body and configured to force air upwardly toward the wafer, and a second heat exchanger at a top portion of the second body and configured to force air downwardly toward the wafer.

9. The wafer cleaning apparatus of claim 1,
wherein
a gas for maintaining a clean atmosphere is supplied to an internal space of the first body and to an internal space of the second body, and
a plurality of slots are defined in the first body and configured to hold the wafer in a plurality of different positions in the internal space of the first body.

10. The wafer cleaning apparatus of claim 9,
wherein the wafer processing unit is configured to accommodate one wafer while the cooling unit is configured to accommodate a plurality of wafers, and
a robot is configured to sequentially transfer the plurality of wafers into the cooling unit and sequentially transfer the plurality of wafers out of the cooling unit after a predetermined time period.

11. The wafer cleaning apparatus of claim 1,
wherein the wafer cleaning apparatus is configured to be mounted on a side surface of cleaning equipment using supercritical fluid, or the wafer cleaning apparatus is configured to be mounted in a load port of the cleaning equipment where wafers are stored.

12. A wafer cleaning apparatus based on light irradiation, the wafer cleaning apparatus comprising:
a light irradiation system comprising at least one lamp configured to generate light and a diffusion lens configured to uniformly diffuse the light from the at least one lamp, the light irradiation system being configured to irradiate the light onto a wafer;
a wafer processing system configured to accommodate the wafer and to control a position of the wafer such that the light having an energy set for the wafer is irradiated onto the wafer for a period of time; and
a cooling system comprising a heat exchanger, the cooling system configured to cool the wafer after the light has been irradiated onto the wafer for the period of time,
wherein the wafer cleaning apparatus is configured to, using the light being irradiated onto the wafer for the period of time, remove isopropyl alcohol (IPA) residue, which remains after a substitution process of the IPA and a $CO_2$ supercritical fluid is performed,
the wafer processing system comprises a first body and the cooling system comprises a second body, and
a plurality of slots are defined in the second body and configured to hold the wafer in a plurality of different vertical positions in horizontal orientations in an internal space of the second body.

13. The wafer cleaning apparatus of claim 12,
wherein the at least one lamp comprises at least one of a water-cooling type device and an air-cooling type device, and,
the wafer processing system is configured to control a rotation of the wafer and a distance of the wafer from the at least one lamp.

14. The wafer cleaning apparatus of claim 12,
wherein the heat exchanger comprises: a first heat exchanger at a bottom portion of the cooling system and is configured to force air upwardly toward the wafer; and a second heat exchanger between the wafer processing system and the cooling system and is configured to force air downwardly toward the wafer.

15. The wafer cleaning apparatus of claim 12,
wherein the wafer processing system comprises at least one sensor, and
a controller is configured to control an amount of the light irradiated based on at least one physical property measured using the at least one sensor.

16. A wafer cleaning system comprising:
a first cleaning apparatus configured to clean and dry a wafer using a supercritical fluid; and
a second cleaning apparatus configured to clean residue on the wafer by light irradiation after the wafer has been cleaned in the first cleaning apparatus,
wherein the second cleaning apparatus comprises:
a light irradiation unit configured to irradiate light onto the wafer during the light irradiation;
a wafer processing unit configured to accommodate the wafer and to control a position of the wafer such that the light of an energy set for the wafer is irradiated onto the wafer during the light irradiation; and
a cooling unit configured to cool the wafer after the light irradiation has been completed,
wherein the light irradiation unit, the wafer processing unit, and the cooling unit are sequentially arranged in a vertical structure with the light irradiation unit above the wafer processing unit and the wafer processing unit above the cooling unit,
the wafer processing unit comprises a first body and the cooling unit comprises a second body, a plurality of first slots are defined in the first body and configured to hold the wafer in a plurality of different vertical positions in horizontal orientations in an internal space of the first body, and a plurality of second slots are defined in the second body and configured to hold the wafer in a plurality of different vertical positions in horizontal orientations in an internal space of the second body.

17. The wafer cleaning system of claim 16, wherein the supercritical fluid comprises a $CO_2$ supercritical fluid, and the second cleaning apparatus is configured to, using the light irradiation, remove isopropyl alcohol (IPA) residue that remains on the wafer after a substitution process of the IPA and the $CO_2$ supercritical fluid is performed.

18. The wafer cleaning system of claim 16, wherein the light irradiation unit comprises at least one lamp configured to generate the light and a diffusion lens configured to uniformly diffuse the light from the at least one lamp, the wafer processing unit is configured to control a rotation of the wafer and a distance of the wafer from the at least one lamp, a first heat exchanger is at a bottom portion of the cooling unit and is configured to force air upwardly toward the wafer, and a second heat exchanger is between the wafer processing unit and the cooling unit and is configured to force air downwardly toward the wafer.

19. The wafer cleaning system of claim 16, further comprising a controller configured to control an amount of light irradiation from the light irradiation unit, wherein the controller is configured to control the amount of light irradiation based on at least one physical quantity obtained using a sensor in the wafer processing unit.

20. The wafer cleaning system of claim 16, wherein the first cleaning apparatus comprises:

at least two load ports where the wafer is held;

at least one cleaning chamber configured to wet clean the wafer; and at least one drying vessel configured to dry the wafer that has been wet cleaned in the at least one cleaning chamber using the supercritical fluid, wherein the second cleaning apparatus is separately mounted on a side surface of the first cleaning apparatus, or in any one of the at least two load ports.

* * * * *